United States Patent
Houghton et al.

(10) Patent No.: US 6,369,606 B1
(45) Date of Patent: Apr. 9, 2002

(54) MIXED THRESHOLD VOLTAGE CMOS LOGIC DEVICE AND METHOD OF MANUFACTURE THEREFOR

(75) Inventors: Russell J. Houghton; William R. Tonti, both of Essex Junction; Thomas Vogelsang, Jericho; Adam B. Wilson, Colchester, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/670,945

(22) Filed: Sep. 27, 2000

(51) Int. Cl.$^7$ .............................................. H03K 19/23
(52) U.S. Cl. .................... 326/36; 326/119; 326/121; 326/98
(58) Field of Search ...................... 326/35, 36, 98, 326/104, 112, 119, 121

(56) References Cited

U.S. PATENT DOCUMENTS

| | | | |
|---|---|---|---|
| 5,440,244 A | 8/1995 | Richter et al. | |
| 5,481,484 A | 1/1996 | Ogawa et al. | |
| 5,798,658 A | 8/1998 | Werking | |
| 5,831,451 A | * 11/1998 | Bosshart | 326/93 |
| 5,982,211 A | * 11/1999 | Ko | 327/202 |
| 6,111,427 A | * 8/2000 | Fujii et al. | 326/34 |
| 6,133,762 A | * 10/2000 | Hill et al. | 326/119 |

* cited by examiner

*Primary Examiner*—Michael Tokar
*Assistant Examiner*—Vibol Tan
(74) *Attorney, Agent, or Firm*—Scully, Scott, Murphy & Presser; H. Daniel Schnurman

(57) ABSTRACT

A logic circuit implementing a logic function and method of manufacture thereof. The logic circuit includes a series connection of two or more CMOS devices, at least one CMOS device having a threshold voltage at an input lower than a threshold voltage at an input of another of the CMOS devices. The CMOS logic circuit exhibits enhanced switching speed for logic operations and reduced leakage current when operating in an off-state. A logic family is built around the series connection of two or more devices having mixed voltage threshold inputs for enhanced switching speed and reduced off-current leakage.

10 Claims, 10 Drawing Sheets

Figure 4(b) NOR

Figure 4(a) NAND

MIXED THRESHOLD VOLTAGE CMOS LOGIC DEVICE AND METHOD OF MANUFACTURE THEREFOR

BACKGROUND OF THE INVENTION

1. Field of the Invention

This present invention relates generally to electronic circuits generally, and more specifically, to CMOS logic circuit devices and device families thereof, each circuit designed with two or more series CMOS transistor elements having different gate voltage thresholds for improved performance.

2. Discussion of the Prior Art

Figure 1A:
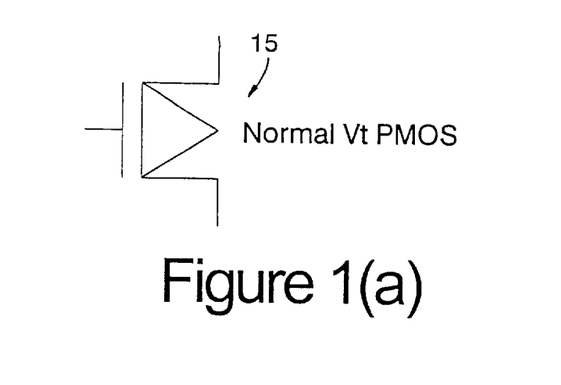
Figure 1B:
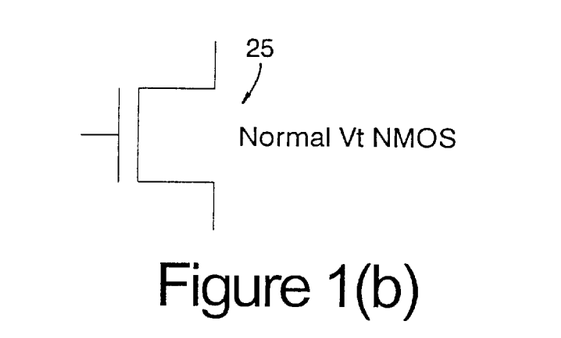
Figure 1C:
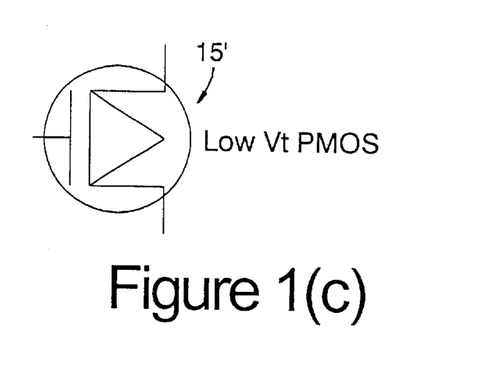
Figure 1D:
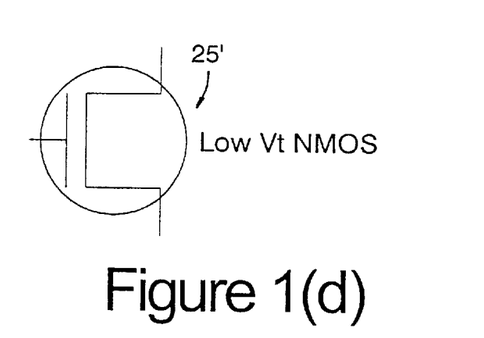
Figure 2A:
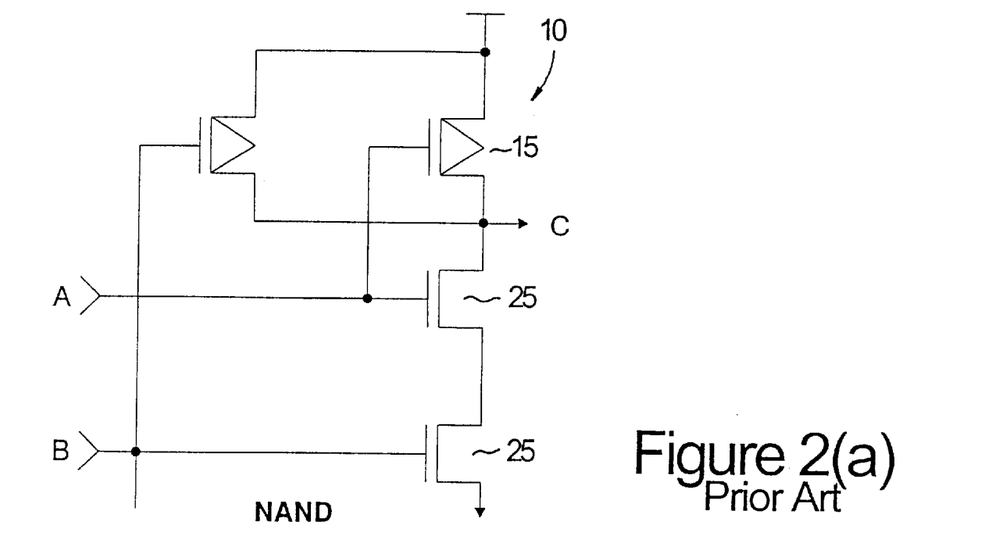
Figure 2B:
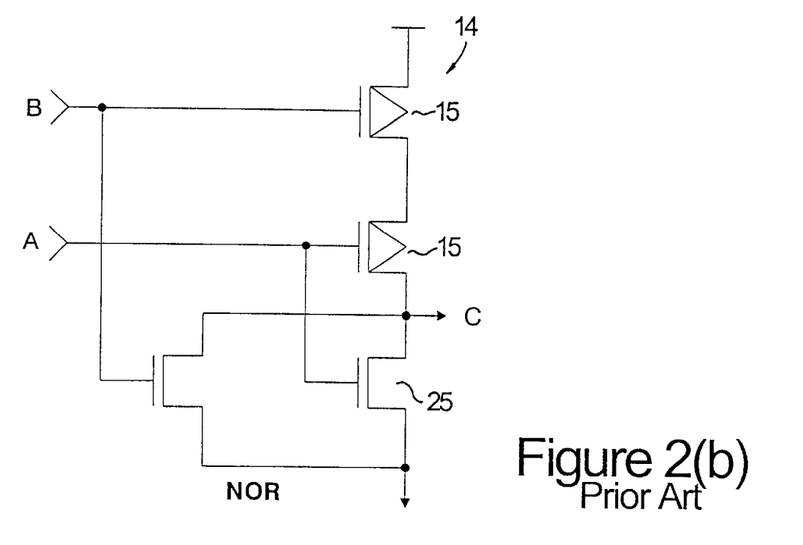

Chip power supply voltages are continually scaling downward as technology advances while device thresholds are remaining relatively constant. As is well known, the speed of CMOS logic gates is proportional to the square of overdrive voltage (VDD-Vt). At VDD of 2.5V and lower, the device overdrive becomes increasingly more sensitive to Vt. This sensitivity is somewhat compensated in modern processes by providing two kinds of Vt's for both NMOS and PMOS devices: 1) a "normal" Vt device that functions to limit "off current", i.e., current when the gate is not biased, i.e. $V_{gate}$<Vt; and, 2) a device having a Vt voltage lower than the normal Vt for improving switching performance (speed) where leakage is not critical. Schematic symbols for a normal Vt device 15 (PMOS) and normal Vt device 25 (NMOS) manufactured according to a modern CMOS process are shown in FIGS. 1(*a*) and 1(*b*), respectively. Schematic symbols for a low Vt device 15' (PMOS) and a low Vt device 25' (NMOS) manufactured according to a modern CMOS process are shown in FIGS. 1(*c*) and 1(*d*), respectively. A "classic" two input CMOS logic NAND gate 10 and two input CMOS logic NOR gate 14 both implemented with normal Vt devices 15 in accordance with the prior art is shown in FIGS. 2(*a*) and 2(*b*).

One typical application of a low Vt device is in a DRAM array sense amplifier operating at ½ bit line voltage (i.e. 0.8V), with only 0.3V or 0.4V overdrive beyond Vt. In this application the drain to source voltage is 0 and leakage is not a problem. In some practices, blocks of low Vt logic may be gated with a "normal" Vt device in order to control leakage.

It would thus be highly desirable to provide an individual CMOS logic gate that exhibits both improved performance and limited leakage by providing a mixed series connection comprising a low Vt CMOS device and a normal Vt CMOS device.

SUMMARY OF THE INVENTION

It is an object of the invention to provide a logic circuit capable of exhibiting enhanced switching speed for logic operations and reduced leakage current when operating in an off-state.

It is another object of the invention to provide a logic circuit family including logic devices capable of exhibiting enhanced switching speed for logic operations and reduced leakage current when operating in an off-state.

According to one aspect of the invention, there is provided a logic circuit implementing a logic function comprising a series connection of two or more devices, at least one device having a threshold voltage at an input lower than a threshold voltage at an input of another of the devices. The logic circuit exhibits enhanced switching speed for logic operations and reduced leakage current when operating in an off-state.

According to another aspect of the invention, there is provided a method for fabricating a CMOS logic circuit comprising the steps of: a) defining an common active well region in a semiconductor material of first conductivity type where the two or more CMOS devices are to be fabricated; b) providing compensation mask to define first and second devices in the common active well region; c) altering conductivity of a second device in the active well by compensation ion implanting, the conductivity of the second device being altered to one of: raise or lower device gate the threshold voltage of the second device; d) patterning gate conductor region for the first and second devices over the common active well; and, e) overlaying separation mask and ion implanting source and drain diffusion regions for the first and second devices, wherein the CMOS logic circuit comprises a series connection of two devices, at least one device being uncompensated and having a threshold voltage at a gate input lower than a threshold voltage at a gate input of a second compensated device.

BRIEF DESCRIPTION OF THE DRAWINGS

Further features and advantages of the invention will become more readily apparent from a consideration of the following detailed description set forth with reference to the accompanying drawings, which specify and show preferred embodiments of the invention, wherein like elements are designated by identical references throughout the drawings; and in which:

FIGS. 1(*a*) through 1(*d*) illustrate schematic symbols for normal Vt devices (FIGS. 1(*a*) and 1(*b*)) and low Vt devices (FIGS. 1(*c*) and 1(*d*)) in a modern CMOS process.

FIG. 2(*a*) and 2(*b*) illustrate respective "classic" two input CMOS NAND/NOR logic gates implemented with normal Vt devices in accordance with the prior art.

FIGS. 3(*a*) and 3(*b*) illustrate respective two input logic mixed Vt CMOS NAND and NOR gates according to the invention.

FIGS. 4(*a*) and 4(*b*) illustrate respective multi-input mixed Vt CMOS logic NAND gate 50 and multi-input mixed Vt logic NOR gate 60.

FIGS. 7(*a*)–7(*d*) depict a methodology according to a first embodiment for fabricating a normal Vt device in series with a low Vt device.

FIGS. 8(*a*)–8(*d*) depict a methodology according to a preferred embodiment for fabricating a normal (high) Vt device in series with a low Vt device (e.g., CMOS NFETs).

FIGS. 9(*a*) and 9(*b*) illustrate comparisons of the physical layouts of the devices formed in accordance with the methodology depicted in FIGS. 7(*a*)–7(*d*) versus the devices formed in accordance with the methodology depicted in FIGS. 8(*a*)–8(*d*).

DETAILED DESCRIPTION OF THE INVENTION

Greater advantage from modern CMOS processes may be realized by a novel inventive circuit approach herein described which teaches mixing of normal and low Vt devices within individual CMOS logic gates for improved performance and limited "off-state" current, i.e., leakage. Skilled artisans will appreciate that conventional CMOS processing techniques including formation of a gate dielectric via deposition or thermal growing, source and drain region formation, formation of a gate conductor on the gate dielectric, optional formation of sidewall spacers, and channel implant tailoring are employed for the manufacture of both the normal and the low Vt devices formed in the CMOS logic gates in accordance with the principles of the invention.

Figure 3A:
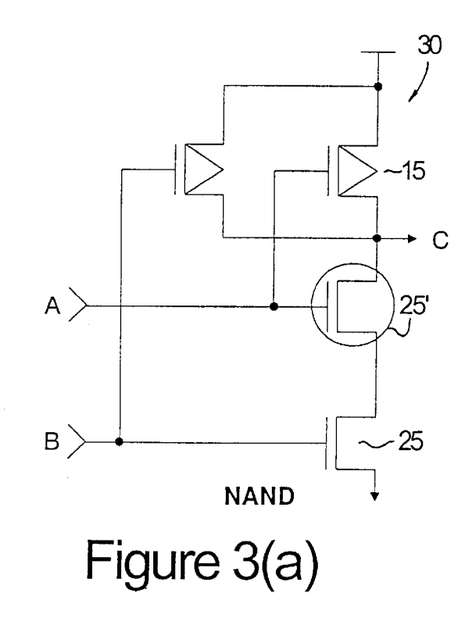
Figure 3B:
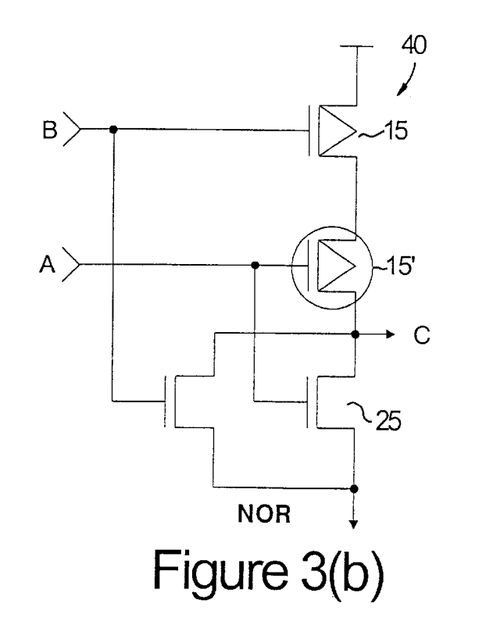

In one example CMOS logic gate according to the invention, FIG. 3(a) illustrates a two input mixed Vt CMOS logic NAND gate 30 comprising a first normal Vt NMOS transistor device 25 in series with a low Vt NMOS transistor device 25'. FIG. 3(b) illustrates an example two input mixed Vt CMOS logic NOR gate 40 comprising a first normal Vt PMOS transistor device 15 in series with a low Vt PMOS transistor device 15' according to the invention. Performance of these inventive two input logic gates is enhanced by making one of the series connected CMOS transistor devices a low Vt device 15', 25' for example, having a voltage threshold of 0.25 V, with the other CMOS input gate comprising a normal Vt device having a voltage threshold of 0.5 V, for example. Device switching speed is enhanced by inclusion of the lower Vt device of the series, while "off-state" leakage is limited by presence of the normal Vt device. A connection restriction must be observed to achieve the lowest possible leakage which restriction requires the inputs to be connected in such a way so that the normal Vt device is the "off" for the greatest percentage of time.

Figure 4A:
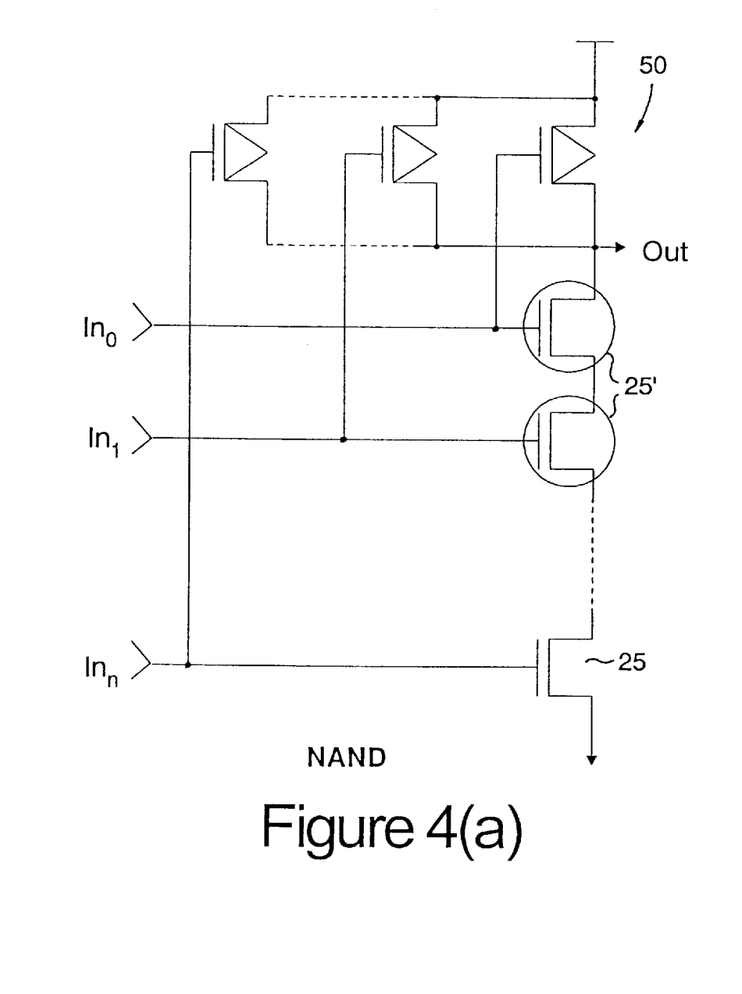
Figure 4B:
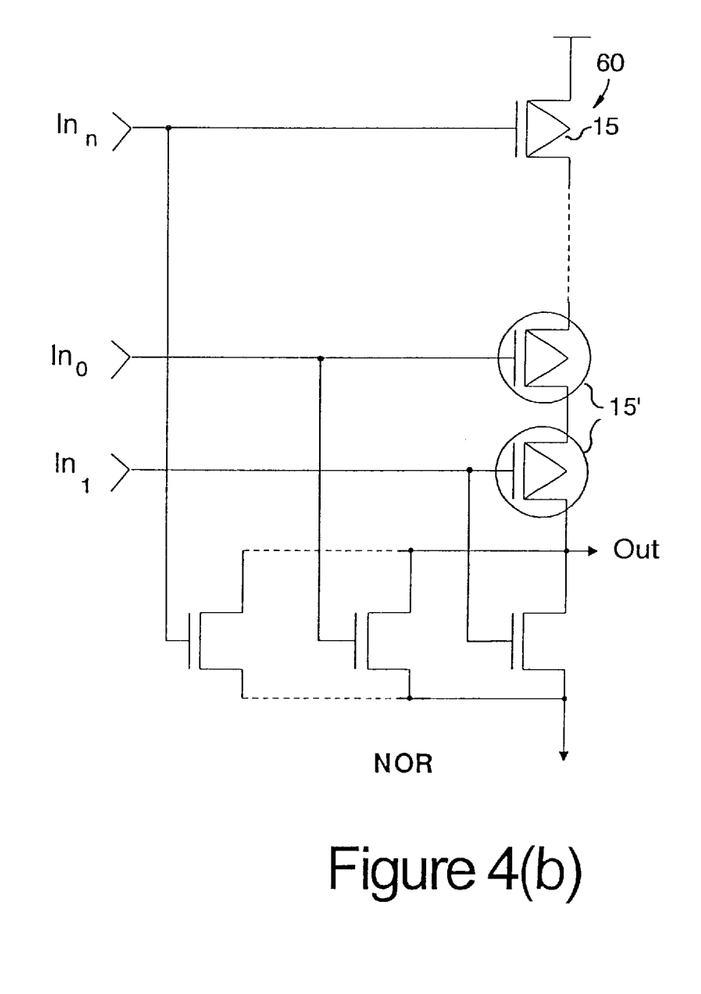

Even greater advantage is realized in a multi-input gate device such as the multi-input mixed Vt CMOS logic NAND gate 50 and multi-input mixed Vt logic NOR gate 60 such as illustrated in respective FIGS. 4(a) and 4(b). As shown in the multi-input gate devices of FIGS. 4(a) and 4(b), only one of the series input CMOS transistor devices is a normal Vt device (device 25 in FIG. 4(a) and device 15 in FIG. 4(b)) to limit leakage. In this case the low Vt device dominates the drive strength of the series input gate connections. As mentioned above, skilled artisans would recognize that a connection restriction must be observed to achieve the lowest possible leakage which restriction requires engineering design of inputs to be connected in such a way so that the normal Vt device is the "off" device for the largest percentage of time (e.g., in a logic operation) in order to prevent undue amount of leakage current.

Figure 5:
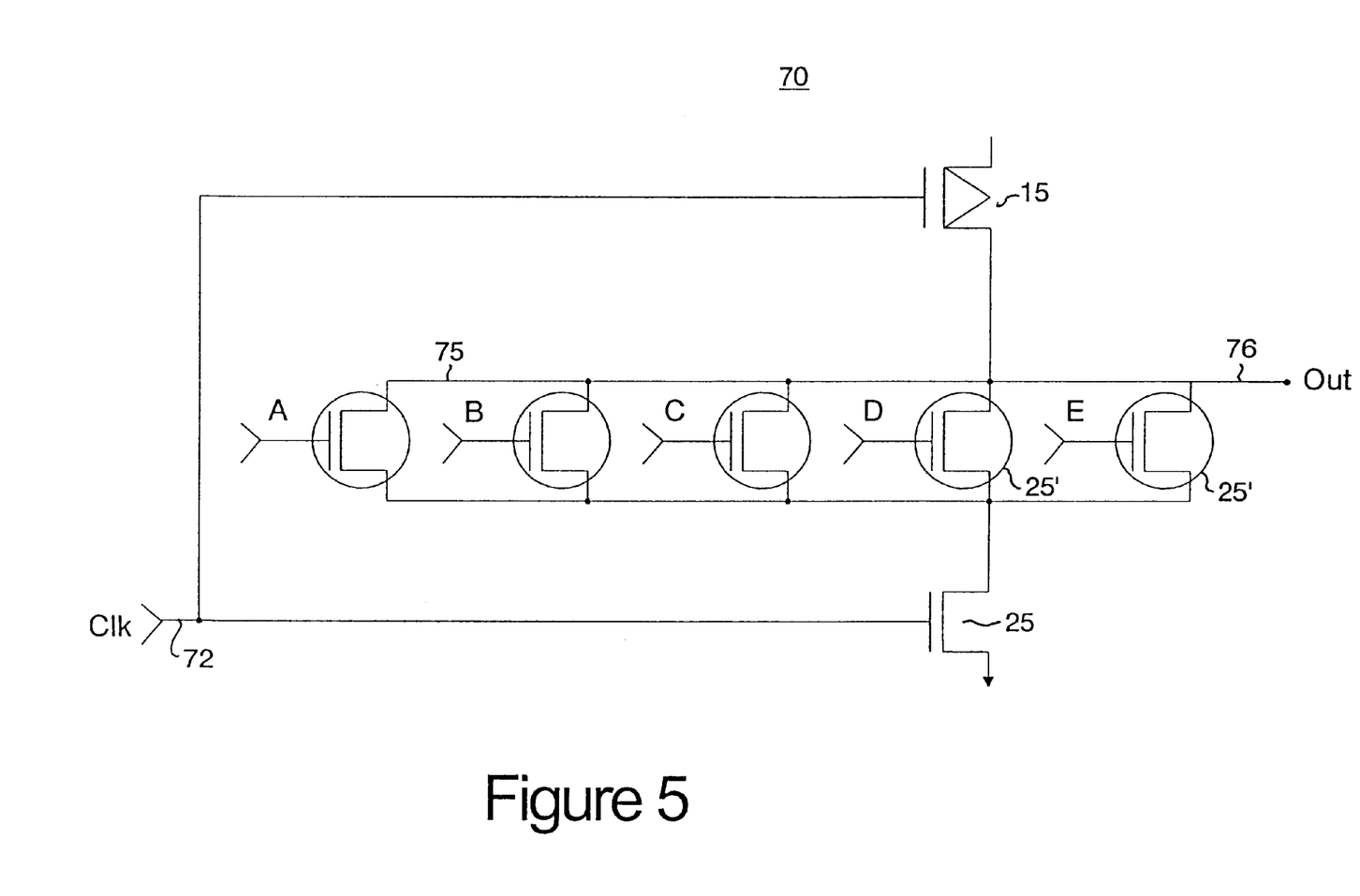
FIG. 5 illustrates a clocked NOR decoder device implementing different threshold voltages according to the invention.

The inventive concept of connecting a normal Vt device in series with low Vt devices as described herein may be extended to any CMOS logic gate having series input connections. As a further example, FIG. 5 illustrates a clocked NOR decoder device 70 having a clock input 72 controlling a series connection of gates including a normal Vt NMOS 25 a normal Vt PMOS 15, each connected in series with a block 75 of parallel connected low threshold NMOS transistors 25' with each low threshold NMOS transistor device having an input (labeled A–E in FIG. 5) and having a common output connection 76. When the clock signal input 72 is low, the outputs are off, and the off-current leakage is limited by the normal Vt NMOS device 25. When the clock goes high, the inputs A–E at the block are evaluated. Thus, if all inputs A–E of the low Vt devices 25' are low, the low Vt devices 25' are off and the output 76 remains high. However, if any one of the A–E block inputs is high, then the output 76 will switch low at a faster speed than a prior art device due to the lower threshold Vt.

Figure 6:
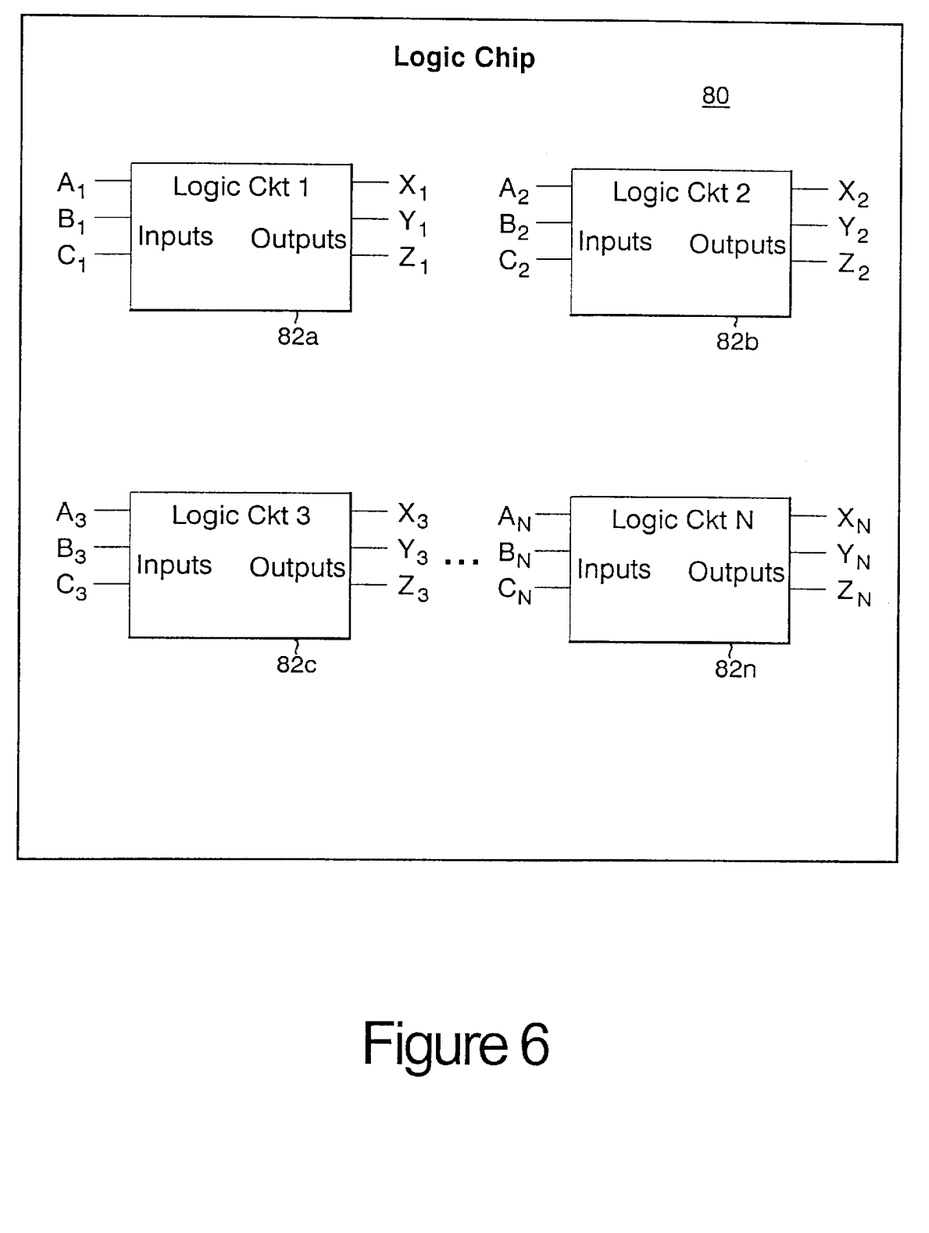
FIG. 6 illustrates a logic chip comprising a plurality of logic circuits each comprising one or more logic gates having a series input connection comprising mixed threshold devices for enhanced switching performance and exhibiting reduced off-current leakage.

It is understood that the implementation of different threshold voltage devices used in a single CMOS logic gate may be extended to any logic chip design. It is understood that the principles described herein are applicable for other types of CMOS logic gates implementing logic functions such as dual or multi-input AND gates, dual or multi-input OR gates, XOR gates, etc., with whole CMOS logic families being developed in accordance therewith. FIG. 6 illustrates a logic chip 80 comprising a plurality of logic circuits 82a, 82b, . . . , 82n each comprising one or more logic gates having a series input connections comprising mixed threshold devices for enhanced switching performance and exhibiting reduced off-current leakage.

Figure 7A:
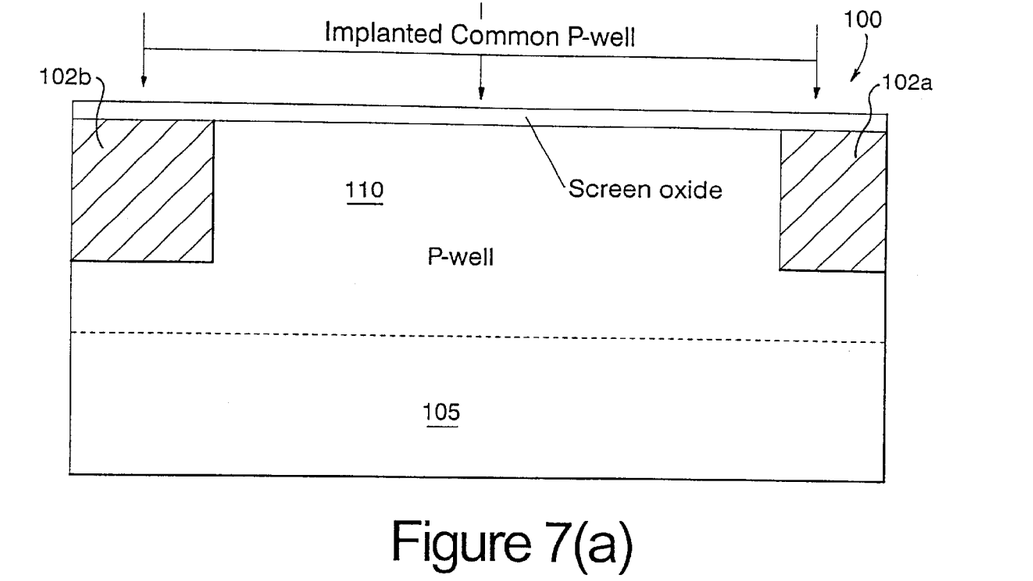
Figure 7B:
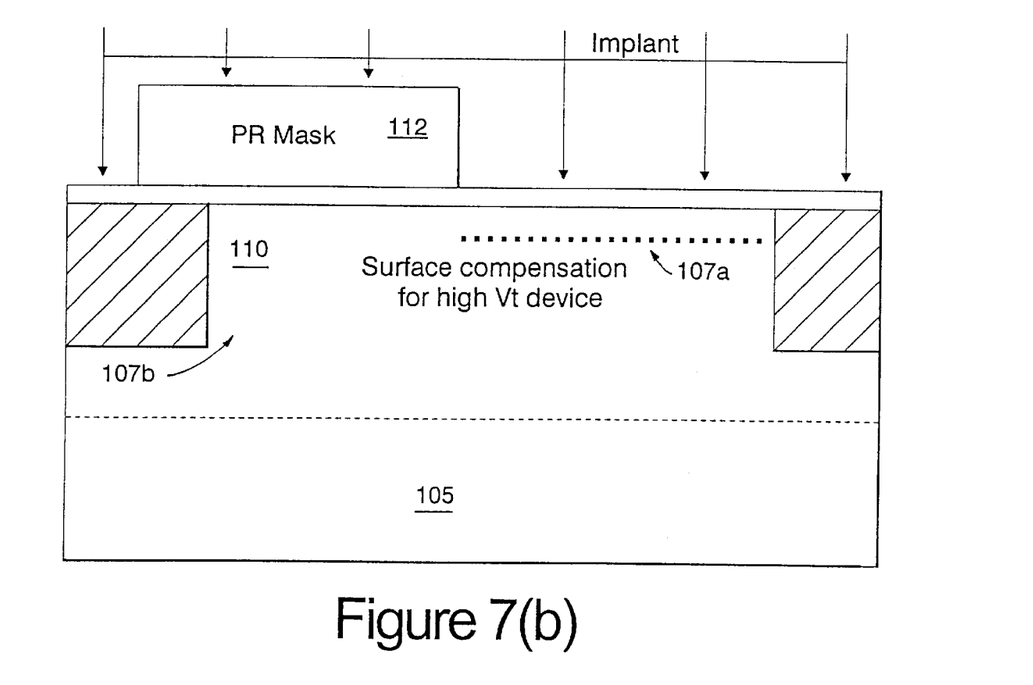
Figure 7C:
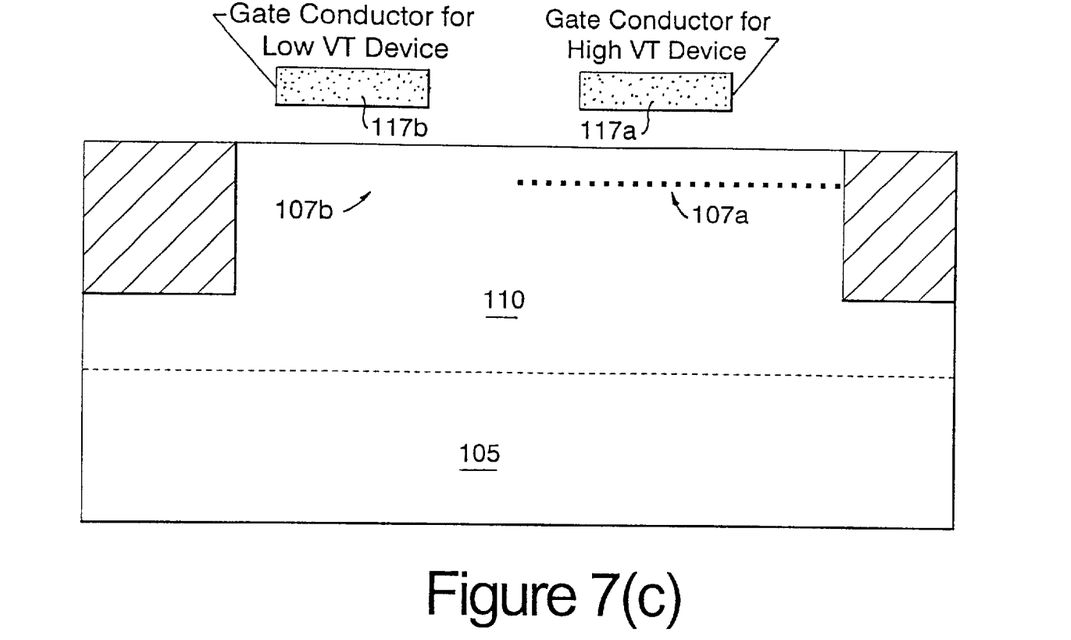

FIGS. 7(a)–7(d) depict a methodology according to a first embodiment for fabricating a normal (high) Vt device in series with a low Vt device (e.g., CMOS NFETs). As shown in FIG. 7(a), a first fabrication step includes defining the gate semiconductor region 100 between trench isolation regions 102a,b and, performing an ion implantation step to create a common well 110 (e.g., p-well) over substrate 105 in which the CMOS devices having attributes of either high Vt or low Vt are to be fabricated. It should be understood that, in FIG. 7(a), the low Vt device attribute is depicted. Then, as illustrated in FIG. 7(b), the each device's Vt is personalized by aligning and covering one device to be formed, e.g., device 107b, with a photo-resist mask 112 and implanting a second device 107a with dopant atoms (e.g., Boron) in order to increase that device's Vt threshold. Thus, in FIG. 7(b) customization is indicated for the high Vt device. It is understood however, that alternately, if the high Vt device was used as the common well, then customization would be employed for the low Vt device, adding an N-type implant for lowering the Vt of an NFET. Next, as depicted in FIG. 7(c), a gate conductor region is defined and patterned (over a dielectric layer not shown) for the two devices 107a,b particularly, by providing a respective gate conductor 117a for the high Vt device an gate conductor 117b for the low Vt device.

Figure 7D:
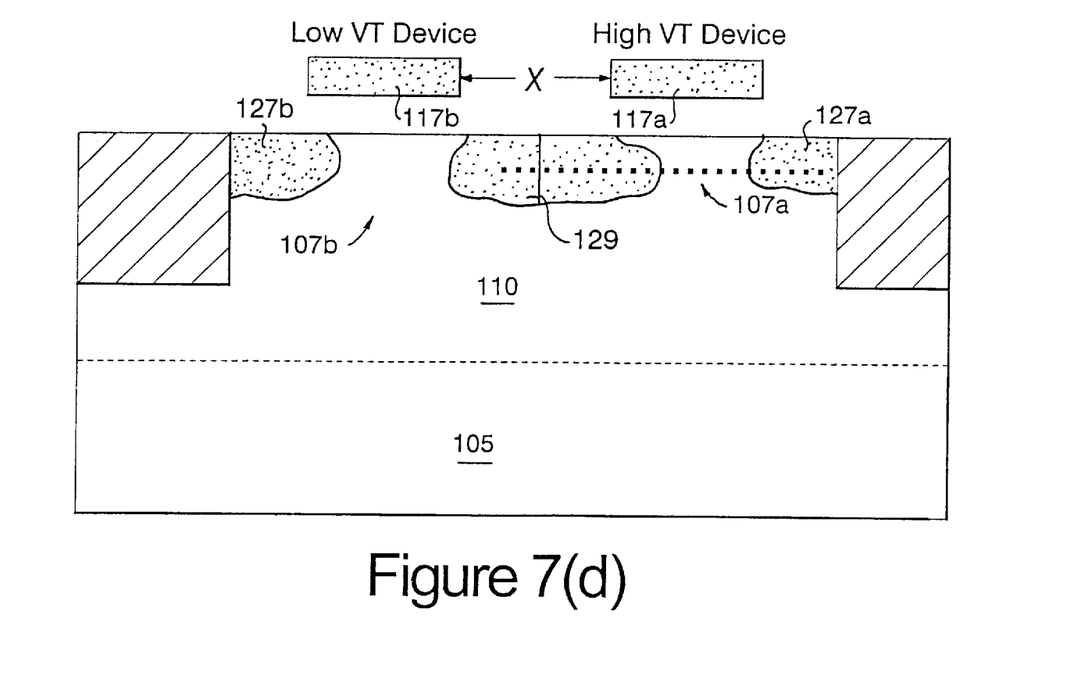

Finally, in FIG. 7(d), each device's drain and source regions are implanted. For example, low Vt device 107b includes drain 127b and high Vt device includes drain 127a device with both devices sharing common source regions 129. In this embodiment, a customization mask lands on the device to be altered. In order to accomplish this, a minimum image plus an overlay tolerance is required to separate the devices, as indicated by the distance "X" in FIG. 7(d). This may lead to a device having an increased layout, resulting in reduced operational speed due to the increase of the internal node device parasitic diffusion capacitance and resistance.

Figure 8A:
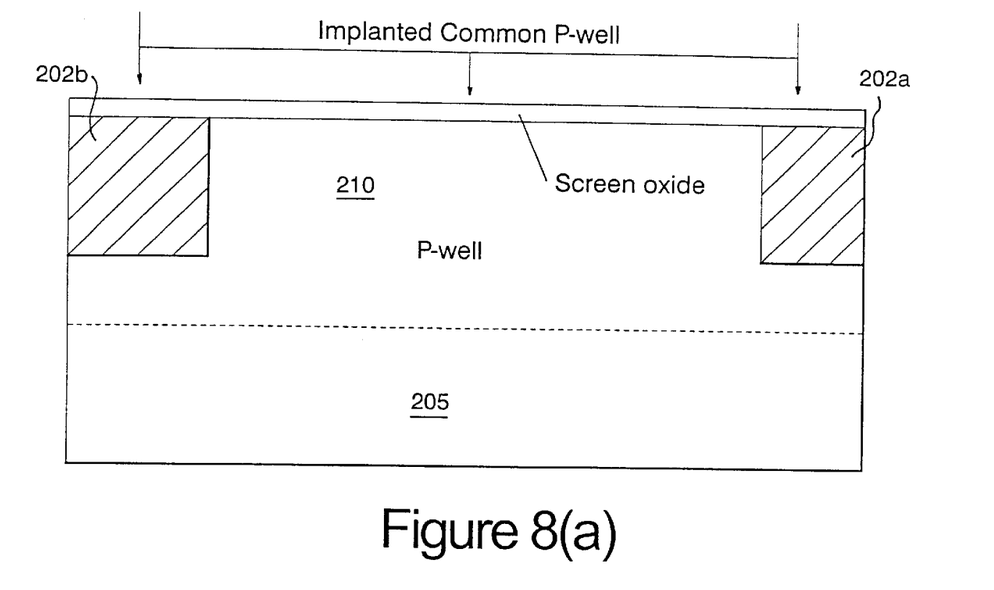
Figure 8B:
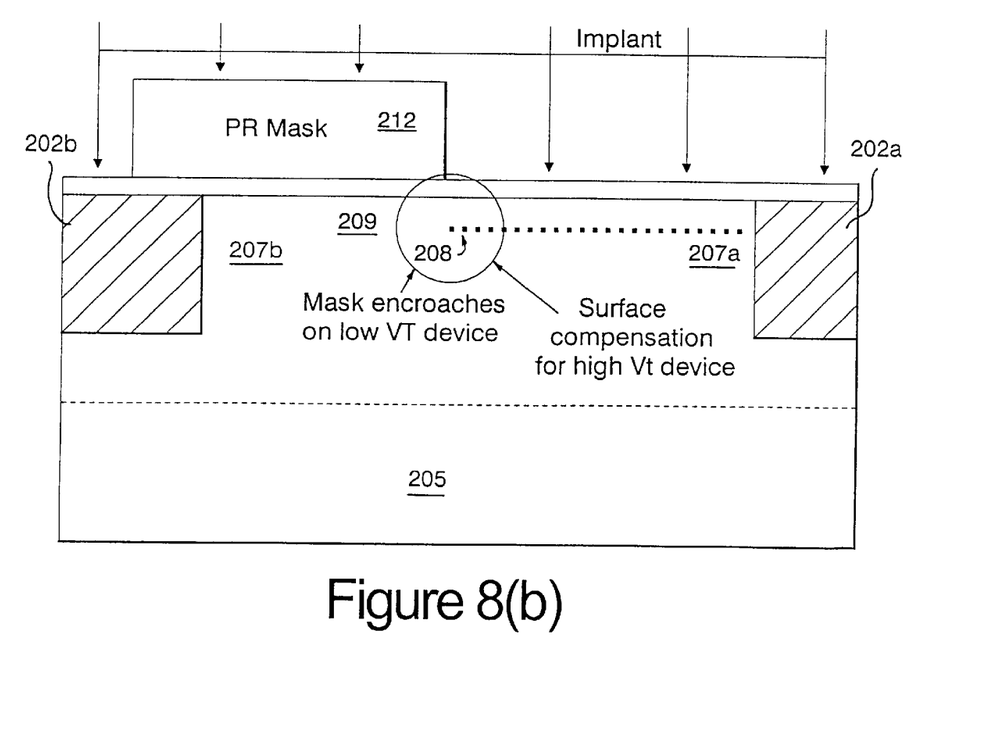

FIGS. 8(a)–8(d) depict a methodology according to a preferred embodiment for fabricating a normal (high) Vt device in series with a low Vt device (CMOS NFETs). As shown in FIG. 8(a), a first fabrication step includes defining the gate semiconductor region 200 between trench isolation regions 202a,b and, performing an ion implantation step to create a common well 210 (e.g., p-well) over substrate 205 in which the CMOS devices having attributes of either high Vt or low Vt are to be fabricated. It should be understood that, in FIG. 8(a), the low Vt device attribute is depicted. Then, as illustrated in FIG. 8(b), the each device's Vt is personalized by aligning and covering one device to be formed, e.g., device 207b, with a photo-resist mask 212 and implanting a second device 207a with dopant atoms (e.g., Boron) in order to increase that device's Vt threshold. It is understood however, that alternately, if the high Vt device was used as the common well, then customization would be employed for the low Vt device, adding an N-type implant for lowering the Vt of an NFET. In this preferred embodiment, as shown in FIG. 8(b), the mask 212 is partially aligned over the low VT device 207b, so that the implant is included within the diffusion region 208 of the low VT device. As the conduction band electron (donor) concentration (Nd) at the junction 208 is much greater than the acceptor concentration (Na) of the Vt compensation region, (e.g., 2–3 orders of magnitude greater), the net effect is that the merged implant is not electrically active. Thus, this concept may be extended allowing the implant to reach beyond the diffusion 208 and extend into the channel 209 of the second device 207b. This concept recognizes the following electrical behaviors: 1) If the diffusion does not enter the channel 209 then the device behavior is exactly as that of the devices fabricated in accordance with the methodology depicted in FIGS. 7(a)–7(d), but the area required to fabricate the structure is significantly reduced; and, 2) If the diffusion enters the channel 209 then the device Vt is still exactly as that of the devices fabricated in accordance with the methodology depicted in FIGS. 7(a)–7(d). However, an added low VT device improvement results in the respect that the Short Channel degradation, or punch-through characteristic of the low VT device improves, as it will scale by the square root of the relative does ratio's: $(Na_{high\_vt}/Na_{low\_vt})^{0.5}$. This enables a smaller gate length to be drawn, e.g., the same size as the high VT device.

Figure 8C:
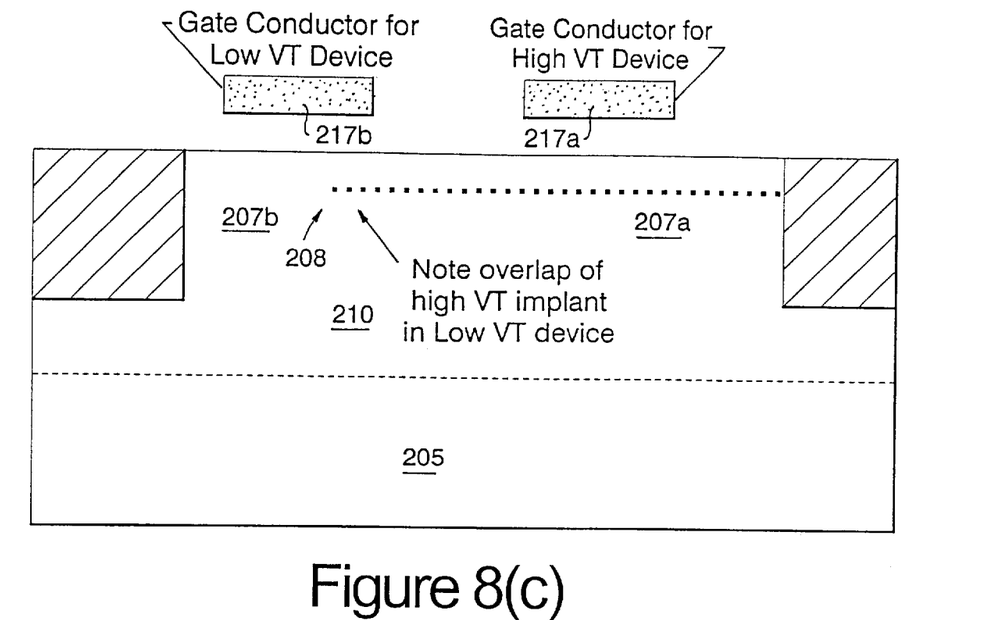
Figure 8D:
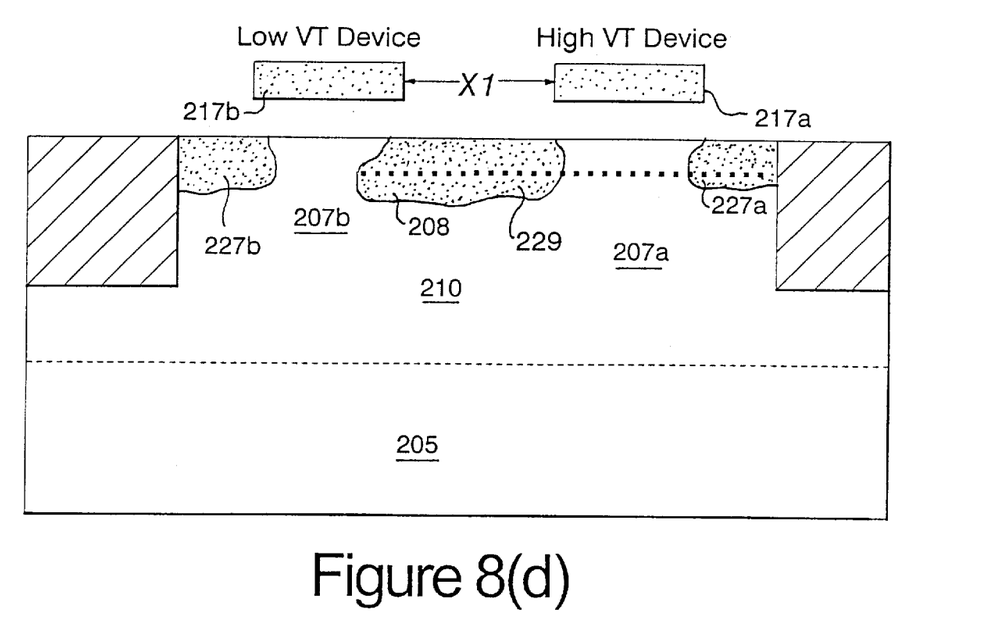

Next, as depicted in FIG. 8(c), a gate conductor region is defined and patterned (over a dielectric layer not shown) for the two devices 207a,b particularly, by providing a respective gate conductor 217a for the high Vt device and gate conductor 217b for the low Vt device. Finally, in FIG. 8(d), each device's drain and source regions are implanted. For example, low Vt device 207b includes drain 227b and high Vt device includes drain 227a device with both devices sharing common source regions 229. In the last step depicted in FIG. 8(d), the customization mask (not, shown) is thus allowed to overlap the non-altered device and the device to be altered. In order to accomplish this, only an overlay tolerance is required to separate the devices, as indicated by the distance "X1" in FIG. 8(d). Comparing this with the device fabricated in accordance with method step 7(d) of the first embodiment, X1<<X implying a smaller geometrical layout, and a higher speed device due to decreased L, and decreased capacitance and resistance of the internally connected node.

Figure 9A:
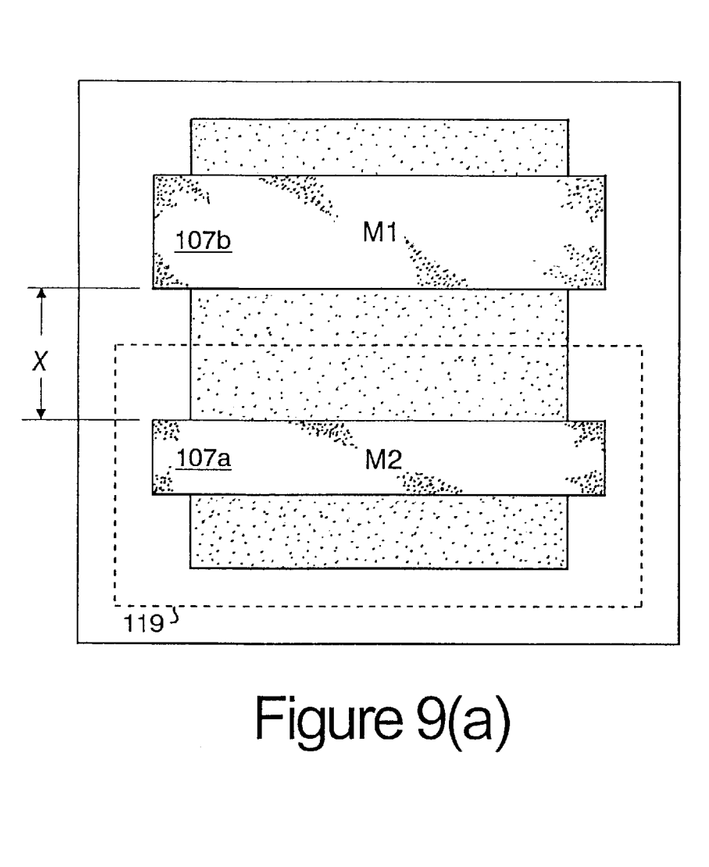
Figure 9B:
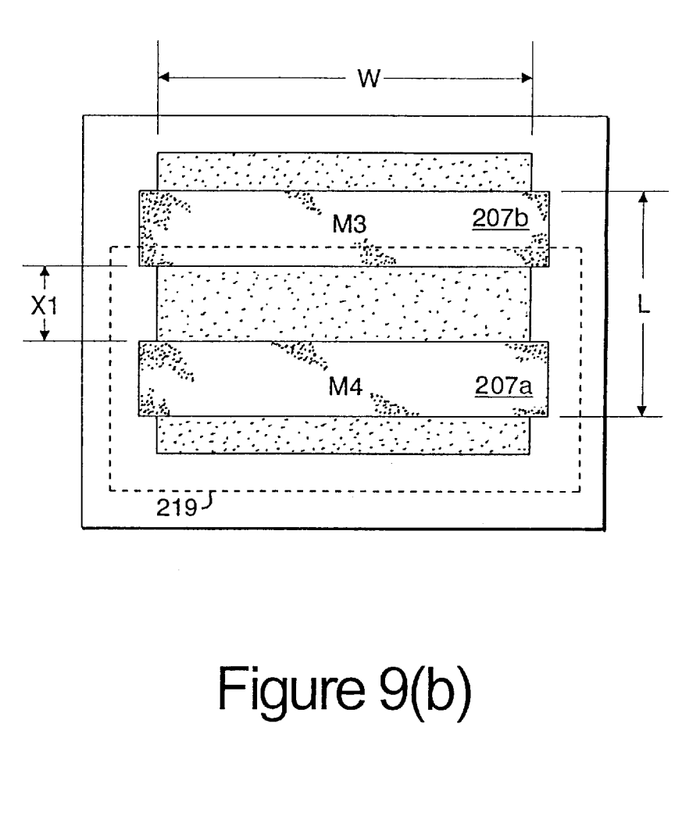

FIGS. 9(a) and 9(b) illustrate comparisons of the physical layouts of the devices formed in accordance with the methodology depicted in FIGS. 7(a)–7(d) versus the devices formed in accordance with the methodology depicted in FIGS. 8(a)–8(d). As shown in FIGS. 9(a) and 9(b), the transistors M1 and M3 represent the physical layout of the low Vt devices 107b and 207b, respectively, and transistors M2 and M4 represent the physical layout of the high Vt devices 107a and 207a, respectively. As shown, the gate length of transistor M3 is less then the gate length of transistor M1, and in accordance with the preferred embodiment, is equal to the gate lengths of the high Vt devices M2 and M4 (which are equal themselves). This is a result of the fabrication methodology of the preferred embodiment, where the short channel effects are suppressed for the low VT device.

As further shown in FIGS. 9(a) and 9(b), the distance X1 is substantially reduced in the preferred embodiment (as compared to the distance X in accordance with the fabrication methodology of the first embodiment, as the Vt compensation mask 229 is permitted to encroach upon the low VT device in the preferred design of FIG. 9(b) as compared to the compensation mask 119 of FIG. 9(a) which does not encroach upon the low Vt device area. It is estimated that the net result in area real estate, i.e., active area savings (estimated as the multiplication of gate conductor widths W by device lengths L, as shown in FIG. 9(b)) is reduced by at least 21% by implementing the fabrication methodology of the preferred embodiment depicted in FIGS. 8(a)–8(d), assuming an overlay tolerance of approximately 0.08 μm.

While the invention has been particularly shown and described with respect to illustrative and preformed embodiments thereof, it will be understood by those skilled in the art that the foregoing and other changes in form and details may be made therein without departing from the spirit and scope of the invention which should be limited only by the scope of the appended claims.

Having thus described our invention, what we claim as new, and desire to secure by Letters Patent is:

1. A CMOS logic circuit implementing a logic function comprising: a series connection of two or more CMOS devices, at least one CMOS device having a threshold voltage at a gate input lower than a threshold voltage at a gate input of another of said CMOS devices, each CMOS device having a respective gate conductor defining a conductor regions, and respective drain and source conducting regions, one of said drain or source regions of each device forming a common junction, each gate conductor having a gate length substantially equal to each other, and said common junction separating said gate conductor regions by a distance commensurate with an overlay tolerance of a patterning image size for preparing said gate conductor regions.

2. The CMOS logic circuit implementing a logic function as claimed in claim 1, wherein one of said two or more CMOS devices includes an NMOS device with a first threshold and another of said two or more CMOS devices includes an NMOS device with a second threshold lower than the first threshold.

3. The CMOS logic circuit implementing a logic function as claimed in claim 1, wherein one of said two or more CMOS devices includes an PMOS device with a first threshold and another of said two or more CMOS devices includes a PMOS device with a second threshold lower than the first threshold.

4. A CMOS logic circuit implementing a logic function comprising a series connection of two or more CMOS devices, at least one CMOS device having a threshold voltage at an input lower than a threshold voltage at an input of another of said CMOS devices, each CMOS device having a gate conductor defining conductor regions, and respective drain and source conducting regions, one of said drain or source regions of each device forming a common junction, each gate conductor having a gate length substantially equal to each other, with said common junction separating said gate conductor regions by a distance commensurate with an overlay tolerance of a patterning image size for preparing said gate conductor regions, whereby switching speed for logic operations is enhanced.

5. The CMOS logic circuit as claimed in claim 4, wherein one of said two or more CMOS devices includes an NMOS device with a first threshold and another of said two or more CMOS devices includes an NMOS device with a second threshold lower than the first threshold, said first NMOS device having an off state drain current and the second NMOS device having a higher off state drain current.

6. The CMOS logic circuit as claimed in claim 4, wherein one of said two or more CMOS devices includes a PMOS device with a first threshold and another of said two or more CMOS devices includes a PMOS device with a second threshold lower than the first threshold, said first PMOS device having an off state current and the second PMOS device having a higher off state of drain current.

7. The CMOS logic circuit as claimed in claim 4, wherein said series connection of two or more CMOS devices includes first and second NMOS devices of mixed voltage threshold and first and second PMOS devices of mixed voltage threshold capable of drawing current from a voltage supply when said logic circuit is in a static condition, whereby current drawn from the voltage supple in a static condition is not greater than that of an equivalent CMOS logic circuit arranged to provide equivalent logic functions having first NMOS and PMOS device of like voltage threshold.

8. The logic circuit as claimed in claim 7, exhibiting a shorter delay than an equivalent CMOS logic circuit arranged to provide equivalent logic functions having first NMOS and PMOS devices of like voltage threshold.

9. A CMOS logic circuit implementing a logic function comprising a series connection of two or more CMOS devices, at least one CMOS device having a threshold voltage at an input lower than a threshold voltage at an input of another of said CMOS devices, each CMOS device having a gate conductor defining conductor regions, and respective drain and source conducting regions, one of said drain or source regions of each device forming a common junction, each gate conductor having a gate length substantially equal to each other, with said common junction separating said gate conductor regions by a distance commensurate with an overlay tolerance of a patterning image size for preparing said gate conductor regions, whereby reduced leakage current is exhibited when operating in an off-state.

10. A CMOS logic circuit family comprising a plurality of logic circuits each implementing a logic function comprising: one or more logic circuits having a series connection of two or more CMOS devices having input gates, at least one CMOS device having a threshold voltage at a gate input lower than a threshold voltage at a gate input of another of said CMOS devices, each CMOS device having a gate conductor defining conductor regions, and respective drain and source conducting regions, one of said drain or source regions of each device forming a common junction, each gate conductor having a gate length substantially equal to each other, with said common junction separating said gate conductor regions by a distance commensurate with an overlay tolerance of a patterning image size for preparing said gate conductor regions.

\* \* \* \* \*